(12) United States Patent
Matthias et al.

(10) Patent No.: US 8,384,186 B2
(45) Date of Patent: Feb. 26, 2013

(54) POWER SEMICONDUCTOR DEVICE WITH NEW GUARD RING TERMINATION DESIGN AND METHOD FOR PRODUCING SAME

(75) Inventors: Sven Matthias, Lenzburg (CH); Arnost Kopta, Zurich (CH)

(73) Assignee: ABB Technology AG, Zurich (CH)

( * ) Notice: Subject to any disclaimer, the term of this patent is extended or adjusted under 35 U.S.C. 154(b) by 150 days.

(21) Appl. No.: 12/972,014

(22) Filed: Dec. 17, 2010

(65) Prior Publication Data
US 2011/0147880 A1 Jun. 23, 2011

(30) Foreign Application Priority Data
Dec. 22, 2009 (EP) .................................... 09180365

(51) Int. Cl.
*H01L 21/70* (2006.01)
(52) U.S. Cl. .................. 257/504; 257/328; 257/E29.327
(58) Field of Classification Search .................. 257/328, 257/504, 438, 492, 330, 331, 332, E29.327, 257/E21.04, E29.021, E29.02, E29.133
See application file for complete search history.

(56) References Cited

U.S. PATENT DOCUMENTS

| | | | |
|---|---|---|---|
| 4,620,211 A | 10/1986 | Baliga et al. | |
| 7,629,626 B1 * | 12/2009 | Suekawa | 257/170 |
| 7,635,878 B2 * | 12/2009 | Suekawa | 257/197 |
| 2005/0253169 A1 * | 11/2005 | Suekawa | 257/197 |
| 2006/0113613 A1 * | 6/2006 | Ninomiya et al. | 257/409 |
| 2007/0228505 A1 * | 10/2007 | Mazzola et al. | 257/471 |
| 2009/0032851 A1 | 2/2009 | Pfirsch et al. | |
| 2010/0019342 A1 * | 1/2010 | Kawano et al. | 257/494 |
| 2010/0276727 A1 | 11/2010 | Storasta et al. | |
| 2011/0024791 A1 * | 2/2011 | Schulze et al. | 257/109 |

FOREIGN PATENT DOCUMENTS

| | | |
|---|---|---|
| EP | 1 909 332 A1 | 4/2008 |
| JP | 2008-004866 A | 1/2008 |

OTHER PUBLICATIONS

European Search Report for EP 09180365.0 dated May 28, 2010.

* cited by examiner

*Primary Examiner* — Cuong Q Nguyen
*Assistant Examiner* — Yosef Gebreyesus
(74) *Attorney, Agent, or Firm* — Buchanan Ingersoll & Rooney PC

(57) ABSTRACT

A power semiconductor device, such as a power diode, and a method for producing such a device, are disclosed. The device includes a first layer of a first conductivity type, a second layer of a second conductivity type arranged in a central region on a first main side of the first layer, a third electrically conductive layer arranged on the second layer, and a fourth electrically conductive layer arranged on the first layer at a second main side opposite to the first main side. A junction termination region surrounds the second layer with self-contained sub-regions of the second conductivity type. A spacer region is arranged between the second layer and the junction termination region and includes a self-contained spacer sub-region of the second conductivity type which is electrically disconnected from the second layer. This spacer sub-region has a width for enabling a reliable alignment of a shadow mask during an ion implantation such that an implanted lifetime control region having carrier lifetime reducing defects may be restricted to a central area while no such defects are implanted into the junction termination region to improve electrical characteristics.

12 Claims, 3 Drawing Sheets

POWER SEMICONDUCTOR DEVICE WITH NEW GUARD RING TERMINATION DESIGN AND METHOD FOR PRODUCING SAME

RELATED APPLICATION

This application claims priority under 35 U.S.C. §119 to European Patent Application No. 09180365.0 filed in Europe on Dec. 22, 2009, the entire content of which is hereby incorporated by reference in its entirety.

FIELD

The present disclosure relates to the field of power electronics, including power semiconductor devices such as a power diode with improved electrical characteristics as well as methods for producing such devices.

BACKGROUND INFORMATION

A known vertical power diode 101 as exemplary shown in FIG. 1 in top view and in FIG. 2 in cross-section includes, for example, a first layer 102 with a low (n−) doped base layer 106 and a high (n+) doped cathode layer 104 on one side 112 of the base layer 106 and a high (p+) doped anode layer 110 on the other side 108 of the base layer 106. The anode and cathode layers 110, 104 can be formed by implantation and a subsequent diffusion of dopants into an n− doped substrate (wafer).

On their outer side the cathode layer 104 and the anode layer 110 are covered with metal layers 114, 116 for electrically contacting the diode 101. The cathode layer 104 and metal layer 114 can extend to the physical edge 118 of the device 101. The anode layer 110, on the other hand, can be terminated at some distance 120 from the edge 118 in order to be able to support an electric field when reverse biased. This is done, for example, by limiting the p+ doped anode layer 110 to a central part 122 of the diode 101 and surrounding it by a field-limiting junction termination 124, sometimes also referred to as "guard ring".

The field-limiting junction termination 124 includes a plurality of ring-shaped (p+) doped sub-regions 126 having a width $w_1$ of, for example, between 5 and 50 µm, and being alternately implemented into a ring-shaped (n−) region 128 being part of the base layer 106 such that each of the (p+) sub-regions 126 is electrically disconnected from neighbouring (p+) sub-regions 126 as well from the (p+) doped anode layer 110. A design, such as an arrangement and dimensions of the sub-regions 126, 128, may have to be specifically optimized for each type of power diode and may depend for example on voltage, power and switching specifications for a specific power device.

The anode metal layer 116 has about the same size as the (p+) doped anode layer 110 itself. The area between the (p+) doped anode layer 110 and the (n+) doped cathode layer 104 can be defined as the active area 130 of the diode 101. It is enclosed by a circumferential area 132.

A known application for such a power diode 101 is as a free-wheeling diode in an IGBT inverter circuit. In such an application, an important part of the diode operation may appear when the diode 101 is switched-off from a conducting on-state to a blocking off-state as the IGBT is switched on.

Due to known effects which are for example described in the Applicant's patent application EP 1 909 332 A1, high voltage diodes may involve local lifetime control in the active area 130 for optimized electrical properties in blocking, switching and conduction state. Therefore, a lifetime control region 134 may be generated close to the anode side surface of the diode 101. This lifetime control region 134 can include defects forming recombination centres which may locally reduce a minority carrier lifetime within adjacent semiconductor material. For example, such defects may be generated by irradiating the anode side surface with ions like hydrogen ions or helium ions. These local irradiation defects can reduce the peak voltage generated in the diode during diode turn off, also known as reverse recovery peak, and may improve the safe operating area.

However, it has been observed that high power diodes having for example a design similar to that shown in FIGS. 1 and 2 may suffer from non-optimum electrical characteristics such as for example non-optimum electrical blocking capability.

SUMMARY

A power semiconductor device with an active region is disclosed comprising: a first layer of a first conductivity type, which has a first main side and a second main side opposite the first main side; a second layer of a second conductivity type, which is arranged in a central region on the first main side, wherein the second layer corresponds to an active region; a junction termination region arranged in a circumferential region on the first main side and surrounding the second layer, the junction termination region comprising at least one sub-region of the second conductivity type implemented into a sub-region of the first conductivity type, wherein subsequent spacer sub-regions laterally enclose each other; a third electrically conductive layer, which is arranged on the second layer on a side opposite the first layer; a fourth electrically conductive layer, which is arranged on the second main side; a spacer region arranged in an intermediate region on the first main side between the second layer and the junction termination region and surrounding the second layer, the spacer region comprising a spacer sub-region of the second conductivity type implemented into a sub-region of the first conductivity type, wherein the spacer sub-region of the second conductivity type laterally encloses the sub-region of the first conductivity type, such that the spacer sub-region is electrically disconnected from the second layer; and a lifetime control region comprising defects reducing a carrier lifetime within adjacent semiconductor material, the lifetime control region extending at least throughout the second layer and throughout a portion of the spacer sub-region and not extending into the junction termination region.

A method for producing a power semiconductor device is disclosed, the method comprising: providing a semiconductor substrate forming a first layer having a first conductivity type and having a first main side and a second main side opposite the first main side; forming a second layer of a second conductivity type, which is arranged in a central region on the first main side; forming a junction termination region in a circumferential region on the first main side, which junction termination region surrounds the second layer, the junction termination region comprising at least one sub-region of the second conductivity type implemented into a sub-region of the first conductivity type, wherein subsequent spacer sub-regions laterally enclose each other; forming a third electrically conductive layer, which is arranged on the second layer on a side opposite the first layer; forming a fourth electrically conductive layer, which is arranged on the second main side; and forming a spacer region in an intermediate region on the first main side between the second layer and the junction termination region, which spacer region surrounds the second layer, the spacer region comprising a spacer sub-region of the second conductivity type implemented into a sub-region of the first conductivity type, which laterally encloses the spacer sub-region of the second conductivity type, such that the spacer sub-region is electrically disconnected from the second layer; wherein the spacer sub-region has a width for enabling an alignment of a shadow-mask with respect to the spacer sub-region.

BRIEF DESCRIPTION OF THE DRAWINGS

Embodiments of the disclosure will be explained in more detail in the following text with reference to the attached drawings in which.

The reference symbols used in the figures and their meaning are summarized in the list of reference symbols attached hereto. The drawings are only schematically and not to scale. Generally, alike or alike-functioning parts are given the same or corresponding reference symbols. The described embodiments are meant as examples only and shall not limit the disclosure.

DETAILED DESCRIPTION

A power semiconductor device is disclosed which can possess improved electrical characteristics, and a method for producing such device. For example, a power semiconductor device is disclosed, such as a power diode having improved electrical blocking capability while at the same time providing satisfying switch-off characteristics.

An exemplary power semiconductor device comprises (a) a first layer of a first conductivity type (e.g., n-type), which first layer has a first main side and a second main side opposite the first main side, (b) a second layer of a second conductivity type (e.g., p-type), which second layer is arranged in a central region on the first main side, (c) a third electrically conductive layer, which is arranged on the second layer on the side opposite the first layer and (d) a fourth electrically conductive layer, which is arranged on the second main side of the first layer. Furthermore, the power semiconductor device comprises a junction termination region arranged in a circumferential region on the first main side and surrounding the second layer, wherein the junction termination region comprises at least one self-contained sub-region of the second conductivity type implemented into a self-contained sub-region of the first conductivity type. Furthermore, the power semiconductor device comprises a spacer region arranged in an intermediate region on the first main side between the second layer and the junction termination region and surrounding the second layer. The spacer region comprises at least one self-contained spacer sub-region of the second conductivity type implemented into a self-contained sub-region of the first conductivity type such that the spacer sub-region is electrically disconnected from the second layer. This spacer sub-region has a width in a lateral direction along the first main side, wherein the width is adapted such as to enable an alignment of a shadow mask with respect to the spacer sub-region during a producing procedure.

A lifetime control region, which comprises defects reducing a carrier lifetime within adjacent semiconductor material, extends at least throughout the second layer and throughout a portion of the spacer sub-region and does not extend into the junction termination region.

Figure 1:
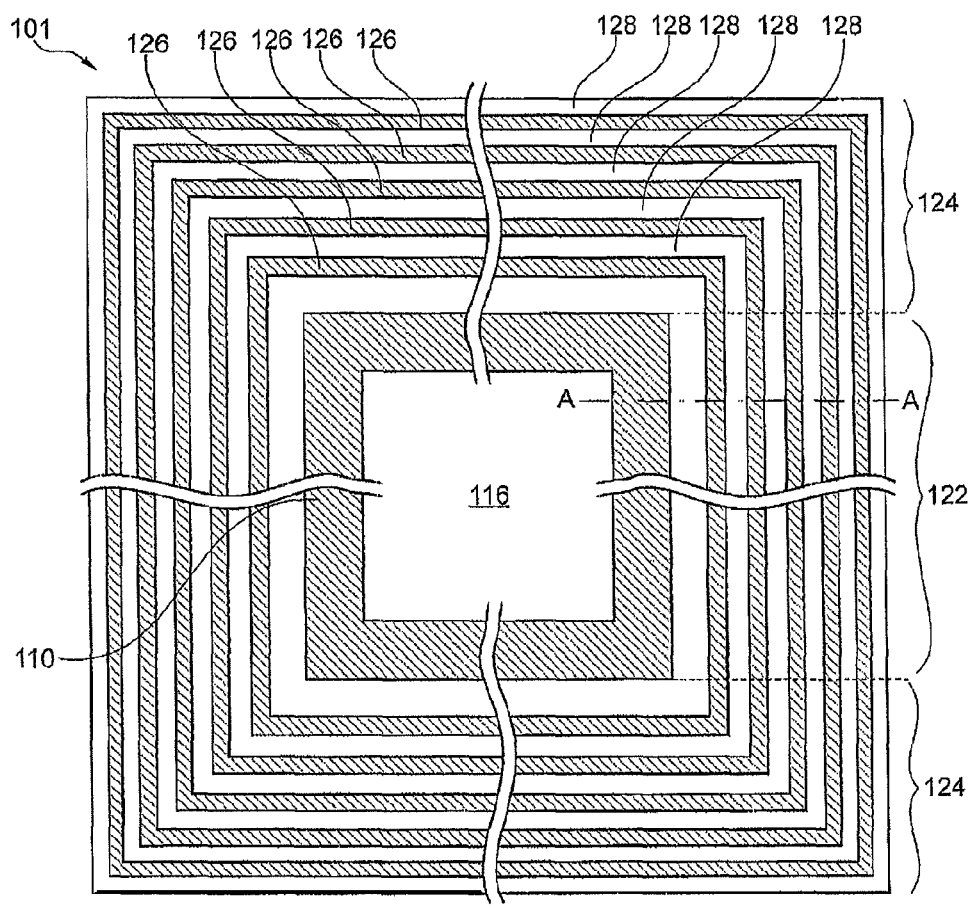
FIG. 1 shows a top view of a known power diode.
Figure 2:
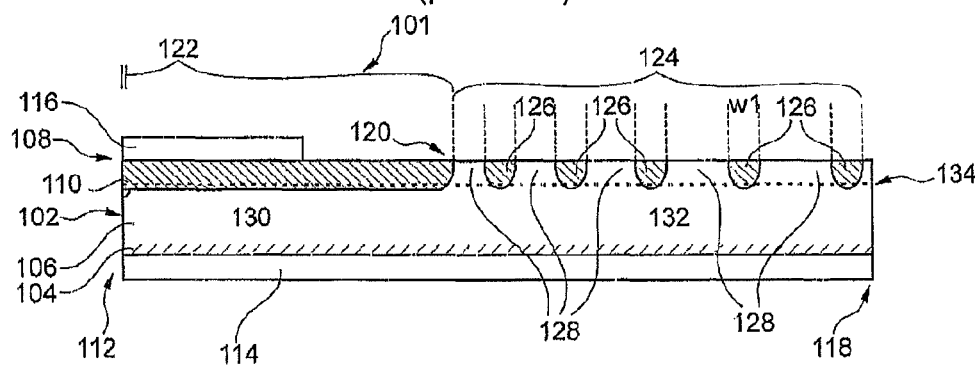
FIG. 2 shows a cross-sectional view of a known power diode of FIG. 1 along the line A-A.

Exemplary features and ideas of the proposed inventive power semiconductor device and its manufacturing process may be based on the following recognitions and considerations:

In known power diodes such as those shown in FIGS. 1 and 2, a lifetime control region 134 can extend throughout both, a central part 122 forming an active region of the diode as well as a circumferential part of the diode including the field-limiting junction termination 124. This fact that the lifetime control region 134 can extend throughout the entire anode side surface of the diode is a result of a producing method used for generating the lifetime control region 134. The entire anode side surface is, for example, irradiated for example with hydrogen ions or helium ions such that these ions are implanted into the anode side surface at a specific depth thereby forming electrically active defects.

However, as will be described further below in more detail, it has been observed that the portion of the lifetime control region 134 extending in the circumferential region of the field limiting junction termination 124 may negatively influence electrical characteristics of the power diode.

It is now an idea to prevent such ion implantation within circumferential region corresponding to the field limiting junction termination region 124. For such purpose, this circumferential region may be protected against ion-implantation using a self-contained shadow-mask covering at least portions of the terminal junction region 124, for example, covering the entire terminal junction region 124.

However, a correct positioning of such shadow mask can be difficult. The shadow mask should be positioned such as to reproducibly cover and protect the terminal junction region 124 during an implantation procedure while leaving a central region including the second layer forming the anode uncovered such that in this region a lifetime control region may be implemented by ion implantation. Misalignments of the shadow mask during a production procedure negatively influence a safe operation area SOA and/or a blocking capability of the diode.

Therefore, additionally to such a junction termination region, in the present disclosure an exemplary spacer region is provided. Such spacer region can be, for example, arranged between the second layer forming the anode and the junction termination region. Similar to the junction termination region, also the spacer region may be ring-shaped and surround the second layer. The spacer region comprises a spacer sub-region of the second conductivity type, such as p-type, forming a self-contained area around the second layer forming the active area of the diode, wherein a self-contained sub-region of the first conductivity type into which the spacer sub-region of the second conductivity type is implemented encloses the spacer sub-region of the second conductivity type in such a way such that the spacer sub-region of the second conductivity type is electrically disconnected from the second layer of the second conductivity type as well as from sub-regions of the second conductivity type comprised in the junction termination region. In other words, the spacer region spaces apart and electrically separates the active area of the diode including the second layer from the junction termination region.

In order to enable reliable and reproducible alignment of the shadow mask with respect to the spacer sub-region, the spacer sub-region should have a sufficient width (e.g., lateral dimension in a direction along the main side surface of the power semiconductor device towards a respective edge thereof). The actual width of the spacer sub-region desired for obtaining reproducible masking results may depend on a type of shadow mask used for protecting the junction termination region. For example, the shadow mask may be a metal mask or silicon mask which is positioned onto the anode side surface of the power semiconductor device during an implantation procedure. A positioning accuracy of such metal or silicon shadow mask may involve a width of the spacer sub-region being, for example between 10 μm and 2000 μm, preferably greater than 100 μm. Alternatively, the shadow mask may be provided with a polymer material such as polyimide which, when provided as a resist or viscous paste, may be applied, for example by screen-printing, onto the anode side surface with a relatively high positioning accuracy. In such case, a width of the spacer sub-region of between 10 μm and 500 μm, preferably at least 50 μm, may be sufficient. In each case, the width of the spacer sub-region may be substantially larger than the width of the sub-regions of the second conductivity type implemented within the junction termination region, for example more than twice that width, preferably more than 2 times, preferably more than 5 times that width.

Using a shadow mask as protection during ion implantation of ions forming a lifetime control region and selecting the geometry of the shadow mask and an alignment of the shadow mask with respect to the spacer sub-region as described above enables that the generated lifetime control region extends throughout the second layer (e.g., throughout the active area including the anode of the semiconductor device), and possibly throughout a portion of the spacer sub-region but preventing that the lifetime control region extends into the junction termination region. Such locally restricting of the lifetime control region to an active area can result in improved electrical characteristics of the power semiconductor device in blocking, switching and/or conducting state.

Lifetime control can be performed using a lifetime control region generated by irradiating the device with ions like helium or hydrogen ions creating two main defect states. Depending on the ion species used, a ratio of two main generated kinds of defects may be modified. Therefore, hydrogen irradiation may result in similar electrical properties of a diode but lower leakage current levels. However, due to hydrogen implantation, an additional n-layer may be formed effecting blocking capability of the device, this blocking capability being mainly determined by the junction termination region. Moreover, the blocking capability may become hydrogen dose-dependent due to such doping effect in this region. Therefore, implantation of helium ions was extensively used for generating a lifetime control region in prior power semiconductor devices. Helium ions enables an optimization of the junction termination region independent of an applied irradiation dose.

However, due to far lower leakage current levels, hydrogen implantation may be very appealing for high temperature operation of the semiconductor device. By using a shadow mask during hydrogen implantation as described above thereby protecting the sensitive junction termination region, implantation of hydrogen within the junction termination region is prevented thereby overcoming the possible disadvantages of hydrogen implantation described above. The shadow mask preferably stops the hydrogen ions completely before the ions can enter into the junction termination region.

It has to be noted that aspects and embodiments of the present disclosure are described herein with reference to different subject-matters. In particular, some features are described with reference to the method for producing the semiconductor device whereas other features are described with reference to the semiconductor device itself. However, a person skilled in the art will gather from the above and the following description that, unless other notified, in addition to any combination or features belonging to one type of subject-matter also any combination between features relating to different subject-matters, in particular between features of semiconductor device and features of the method for producing such device, is considered to be disclosed with this application.

Figure 3:
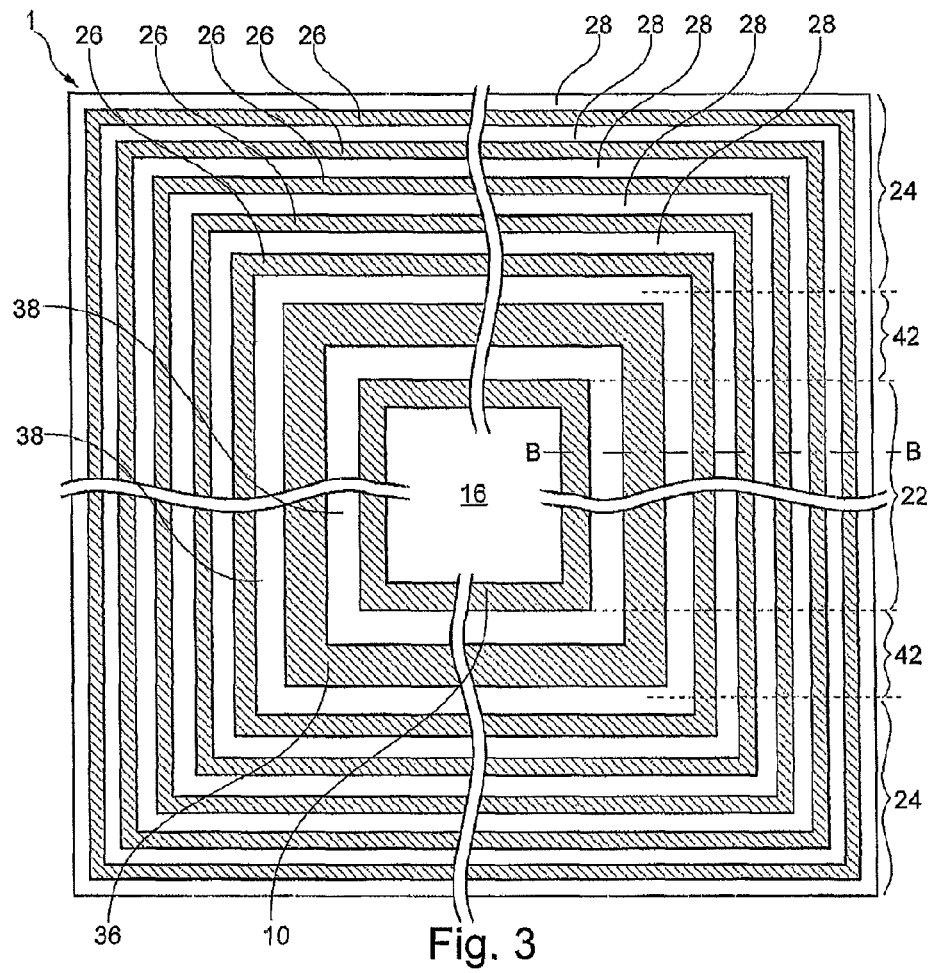
FIG. 3 shows a top view of a power diode according to an exemplary embodiment of the present disclosure.
Figure 4:
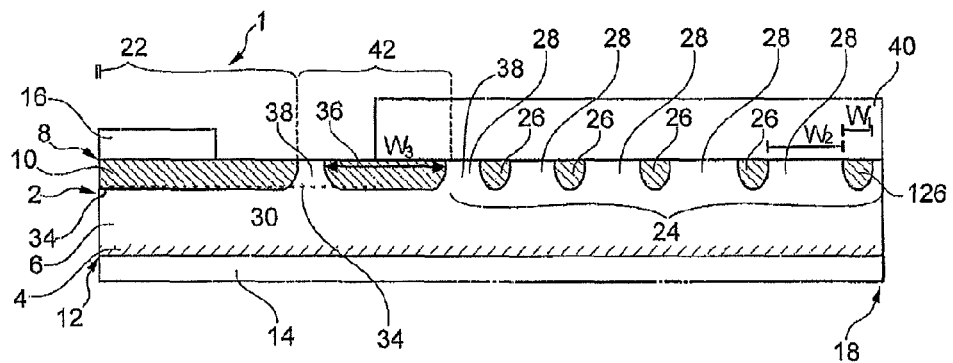
FIG. 4 shows a cross-sectional view of the power diode of FIG. 3 along the line B-B.

FIG. 3 and FIG. 4 show a top view and a cross-sectional view, respectively, of a power semiconductor device 1 being a power diode according to an exemplary embodiment of the present disclosure.

In a high quality float zone silicon wafer serving as a substrate, a first layer 2 forming a base is provided. The first layer 2 of a first conductivity type, exemplarily of an n-type doping. The first layer 2 comprises a first main side 8 and a second main side 12 opposite to the first main side 8. Within the first layer 2, an (n−) type region 6 forming a base layer and an (n+) type region 4 forming a cathode layer are provided. In a central region 22 of the first main side 8, a second layer 10 forming an anode and having, as a second conductivity type, a (p+) type doping is provided. Both, the (p+) type doping of the second layer 10 as well as the (n−) type doping of the cathode layer 4 may be generated by ion implantation of e.g. boron and phosphorous, respectively, and subsequent diffusion of the implanted dopants at high temperatures.

On top of the second layer 10, a third electrically conductive layer 16 formed by a metallization serves as an anode contact. A fourth electrically conductive layer 14 arranged on the second main side 12 of the first layer 2 or, more precisely, the cathode layer 4 included therein, is also formed by a metallization and serves as a cathode contact.

In a circumferential region on the first main side 8 of the diode 1, a junction termination region 24 is provided. Similarly as in conventional power semiconductor devices, this junction termination region 24 surrounds the second layer 10 provided in the central region 22 and comprises one or more sub-regions 26 of the second conductivity type (e.g., (p+) type), enclosed by self-contained sub-regions 28 of the first conductivity type (e.g;, (n−) type). The (p+) type sub-regions 26 may be formed in the same ion implantation step as the (p+) type anode layer 10. The (n−) type sub-regions 28 may be part of the first layer 2 into which the (p+) type sub-regions 26 are implemented. Each of the sub-regions 26 of the second conductivity type has a width w1 (e.g., a lateral extension along the first main side 108 and perpendicular to a longitudinal main extension of the sub-region 26, of for example between 5 and 50 μm). Since the sub-regions 26 do not contribute but support terminating the field to the edge 18 of the substrate, their widths may be reduced as much as possible to save space. The intermediate sub-regions 28 of the first conductivity type spacing apart the sub-regions 26 of the second conductivity type have a width w2 of for example between 5 and 200 μm. The widths w1, w2 may differ for each of the sub-regions 26, 28. For example, the width w2 of the intermediate sub-regions 28 may increase from the inner sub-region to the outer sub-regions towards the edge 18 of the substrate. The sub-regions 26, 28 are self-contained regions, which laterally enclose one other.

Self-contained regions are regions which are closed. These regions may be formed as rings, squares or any other appropriate design.

The design of the junction termination region 24 may be optimized for a specific type of power semiconductor device. For example, such design may depend on voltage and current ratings and on an envisaged operating temperature, etc. Depending on such specifications, the width and depth of each of the sub-regions 26 of the second conductivity type and their doping profiles as well as the width of the sub-regions 28 of the first conductivity type may be optimized. As such design optimization may be time-consuming and laborious, a same junction termination region design may be used for a power semiconductor device according to embodiments of the present disclosure as for conventional power semiconductor devices. Accordingly, an already existing optimized design does not have to be re-calculated for a device according to an embodiment of this disclosure.

Between the junction termination region 24 and the second layer 10 corresponding to an active region 30 provided in the central region 22 of the diode 1, a spacer region 42 is arranged on the first main side 8 of the first layer 2. This spacer region 42 comprises a self-contained spacer sub-region 36 of the second conductivity type implemented into a self-contained sub-region 38 of the first conductivity type. Accordingly, the sub-region 38 of the first conductivity type encloses the spacer sub-region 36 of the second conductivity type such that the spacer sub-region 36 is spaced apart from both, the second layer 10 of the anode and an innermost sub-region 26 of the second conductivity type of the junction termination region 24. Accordingly, the spacer sub-region 36 of the second conductivity type of the spacer region 42 is electrically disconnected from both, the second layer 10 and such inner sub-region 26 of the junction termination region. The sub-regions 36, 38 are self-contained regions, which laterally enclose one other. These regions may be formed as rings, squareas or any other appropriate design.

A width w3 of the spacer sub-region 36 may be in a range of for example 10-500 μm. Accordingly, the spacer sub-region 36 may also be interpreted as an additional sub-region 26 of the second conductivity type, but having a significantly greater thickness than the sub-region 26 comprised in the junction termination region 42. The (p+) type spacer sub-regions 36 may be formed in the same ion implantation step as the (p+) type anode layer 10. The (n−) type sub-regions 38 may be part of the first layer 2 into which the (p+) type spacer sub-regions 36 are implemented.

In order to generate a lifetime control region 34 by implanting defects into the semiconductor material but to restrict this defect implementation substantially to an active region 30 comprising the second layer 10 forming the anode while not implementing such lifetime control region 34 within the junction termination region 24, a shadow mask 40 protecting the junction termination region 24 during an ion implantation procedure are deposited onto the first main side 8 in the junction termination region 24. For example, such shadow mask 40 may be provided as a resist comprising polyimide of sufficient thickness, wherein such shadow mask layer may subsequently, after the ion implantation procedure, be removed from the surface of the semiconductor device or, alternatively, remain thereon. Alternatively, the shadow mask 40 may also be provided with a thin metal or silicon or any other ion-stopping material mask.

Depending on the process for applying the shadow mask 40 onto the semiconductor substrate, different aligning accuracies may be possible. For example, when using a structured metal sheet as a shadow mask 40 and positioning the same on the front surface of the substrate, a relatively low aligning accuracy of less than some hundreds of micrometers may be realized. In such case, the width w3 of the spacer sub-region 36 should be relatively large, for example more than 300-2000 μm, in order to correspond with such aligning accuracy. Alternatively, the shadow mask 40 may be applied with more precise techniques such as screen printing or even photolithography allowing aligning accuracies of some ten micrometers or even less. In such case, the width w3 of the spacer sub-region 36 may be smaller such as for example only 10-50 μm.

In order to generate the lifetime control region 34, hydrogen ions may be implanted into the second layer 10 in the active region 30 as well as in portions of the spacer region 42 via ion implantation. Therein, implantation energies for hydrogen ions of for example between 500 keV and 1600 keV and implantation doses of between $1e11$ cm$^{-2}$ and $1e13$ cm$^{-2}$ may be used.

Figure 5:
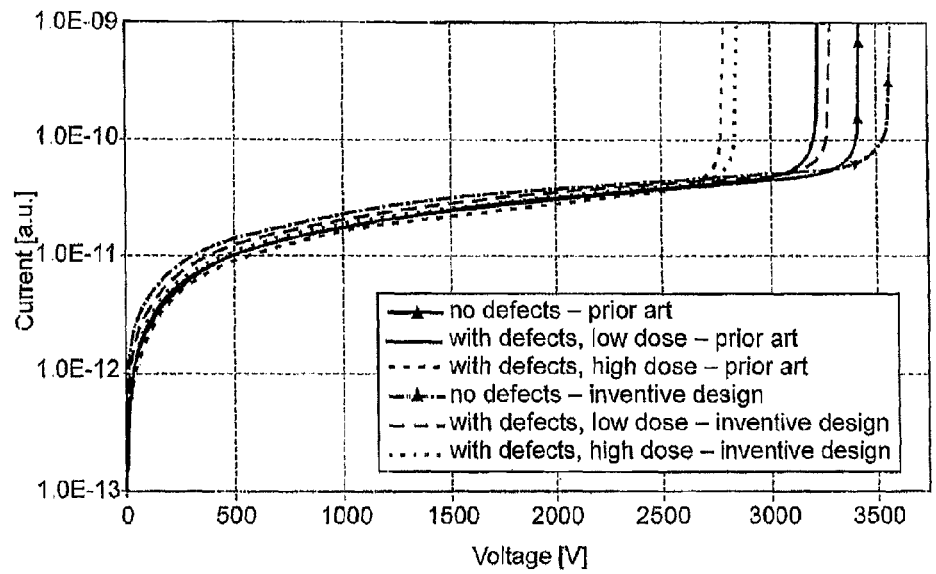
FIG. 5 shows an exemplary graph indicating a simulated current versus a voltage for a known power diode and for power diodes according to embodiments of the present disclosure.

FIG. 5 shows the influence of the hydrogen irradiation on blocking curves both for a known design as shown in FIGS. 1 and 2 as well as for designs of power diodes according to exemplary embodiments of the present disclosure as shown in FIGS. 3 and 4 confirming a dose-dependence. As a reference, a best blocking may be achieved without using hydrogen irradiation (e.g., without implanting protons). There is a slight improvement in blocking voltage for the design according to the embodiment of the present disclosure, which may be related to a field reduction between active central area 22 and spacer region 42. However, this amount may be negligible compared to a shift caused by an implanted hydrogen dose. For both designs, a significant dose-dependent blocking voltage loss is evident at high radiation doses.

Figure 6:
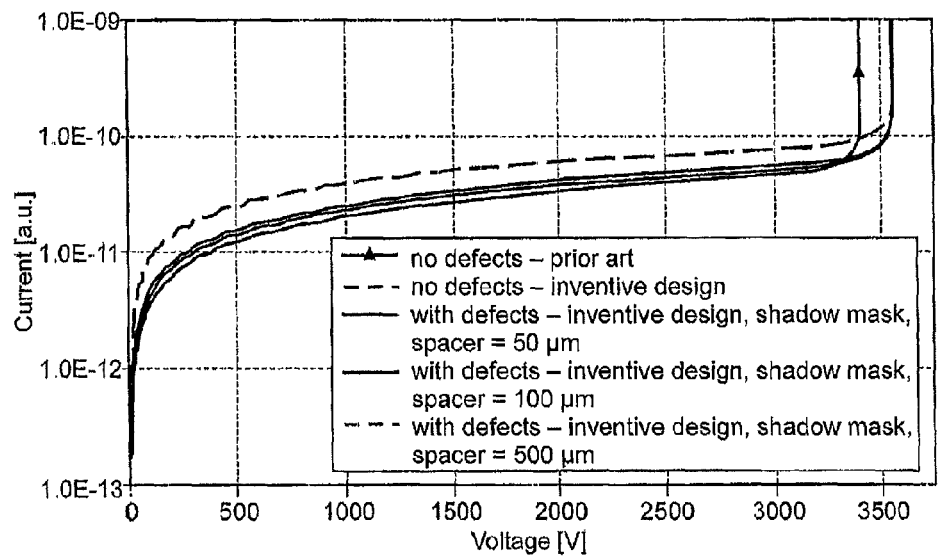
FIG. 6 shows a graph indicating a simulated current versus a voltage for a known power diode and power diodes according to embodiments of the present disclosure for different spacer widths.

FIG. 6 shows simulation results for a combination of the new design according to embodiments of the present disclosure with the shadow mask. It is demonstrated that a blocking voltage of such device may be independent of the implanted hydrogen dose and independent of a width of the spacer sub-region 36. Hence, the spacer dimension may be tuned to an accuracy level of the shadow mask alignment without effecting blocking capabilities. Moreover, optimized junction termination region designs of previous technologies may still be used for the new design.

The disclosure may also be applied for other types of semiconductor devices like IGCTs, IGBTs, reverse conducting-IGBTs, PCTs or bipolar insulated gate transistors (BIGT) (e.g. disclosed in the applicant's European patent application 09159009.1, not published yet) or any other device. Depending on the type of device, the device may comprise also other layers of the first and second conductivity type and further elements (e.g., like a gate electrode).

Summarizing, according to an exemplary idea of the disclosure, a new junction termination region design or guardring design which may be generated in combination with a shadow mask enabling high blocking capabilities and increased save operating areas SOA high-voltage diode and BIGT applications is proposed. An exemplary design feature is based on the introduction of a spacer region next to the junction termination region thereby allowing a tolerant alignment of the shadow mask blocking ions during ion implantation for generating a lifetime control region.

In another exemplary embodiment, the conductivity types are switched; for example, all layers of the first conductivity type are p type (e.g. the first layer 2) and all layers of the second conductivity type are n type (e.g. the second layer 10).

It should be noted that the term "comprising" does not exclude other elements or steps and that the indefinite article "a" or "an" does not exclude the plural. Also elements described in association with different embodiments may be combined. It should also be noted that reference signs in the claims shall not be construed as limiting the scope of the claims.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

LIST OF REFERENCE SIGNS

1 Power semiconductor device
2 First layer
4 Cathode layer
6 Base layer
8 First main side
10 Second layer
12 Second main side
14 Third electrically conductive layer/cathode contact
16 Fourth electrically conductive layer/anode contact
18 Device edge
22 Central area
24 Junction termination region
26 Sub-region of second conductivity type
28 Sub-region of first conductivity type
30 Active region
34 Lifetime control region
36 Spacer sub-region of second conductivity type
38 Sub-region of first conductivity type
40 Shadow mask
42 Spacer region
100 Power semiconductor device
102 First layer
104 Cathode layer
106 Base layer
108 First main side
110 Second layer
112 Second main side
114 Third electrically conductive layer/cathode contact
116 Fourth electrically conductive layer/anode contact
118 Device edge
120 Distance from edge
122 Central area
124 Junction termination region
126 Sub-region of second conductivity type
128 Sub-region of first conductivity type
130 Active region
132 Circumferential area
134 Lifetime control region

What is claimed is:

1. Power semiconductor device with an active region comprising:
a first layer of a first conductivity type, which has a first main side and a second main side opposite the first main side;
a second layer of a second conductivity type, which is arranged in a central region on the first main side, wherein the second layer corresponds to an active region;
a junction termination region arranged in a circumferential region on the first main side and surrounding the second layer, the junction termination region comprising at least one sub-region of the second conductivity type implemented into a sub-region of the first conductivity type, wherein subsequent spacer sub-regions laterally enclose each other;
a third electrically conductive layer, which is arranged on the second layer on a side opposite the first layer;
a fourth electrically conductive layer, which is arranged on the second main side;
a spacer region arranged in an intermediate region on the first main side between the second layer and the junction termination region and surrounding the second layer, the spacer region comprising a spacer sub-region of the second conductivity type implemented into a sub-region of the first conductivity type, wherein the spacer sub-region of the second conductivity type laterally encloses the sub-region of the first conductivity type, such that the spacer sub-region is electrically disconnected from the second layer; and
a lifetime control region comprising defects reducing a carrier lifetime within adjacent semiconductor material, the lifetime control region extending at least throughout the second layer and throughout a portion of the spacer sub-region and not extending into the junction termination region.

2. The power semiconductor device of claim 1, wherein a width of the spacer sub-region of the second conductivity type is larger than a width of the at least one sub-region of the second conductivity type.

3. The power semiconductor device of claim 2, wherein ions forming the lifetime control region comprise hydrogen ions or helium ions.

4. The power semiconductor device of claim 3, comprising:
a layer covering the junction termination region and at least a portion of the spacer region.

5. The power semiconductor device of claim 3, wherein the power semiconductor device is a power diode.

6. The power semiconductor device of claim 1, wherein a width of the spacer sub-region of the second conductivity type is two times larger than a width of the at least one sub-region of the second conductivity type.

7. The power semiconductor device of claim 1, wherein a width of the spacer sub-region of the second conductivity type is five times larger than a width of the at least one sub-region of the second conductivity type.

8. The power semiconductor device of claim 1, wherein the spacer sub-region has a width of at least 10 μm.

9. The power semiconductor device of claim 1, wherein ions forming the lifetime control region comprise hydrogen ions or helium ions.

10. The power semiconductor device of claim 1, comprising:
a layer covering the junction termination region and at least a portion of the spacer region.

11. The power semiconductor device of claim 10, wherein the layer comprises:
a polymer material.

12. The power semiconductor device of claim 1, wherein the power semiconductor device is a power diode.

* * * * *